US012160214B2

(12) United States Patent
Smirnov et al.

(10) Patent No.: US 12,160,214 B2
(45) Date of Patent: Dec. 3, 2024

(54) LOUDNESS EQUALIZATION SYSTEM

(71) Applicant: Immersion Networks, Inc., Renton, WA (US)

(72) Inventors: Serge Smirnov, Redmond, WA (US); James David Johnston, Redmond, WA (US)

(73) Assignee: Immersion Networks, Inc., Redmond, WA (US)

( * ) Notice: Subject to any disclaimer, the term of this patent is extended or adjusted under 35 U.S.C. 154(b) by 261 days.

(21) Appl. No.: 17/910,017

(22) PCT Filed: Mar. 12, 2021

(86) PCT No.: PCT/US2021/022153
§ 371 (c)(1),
(2) Date: Sep. 8, 2022

(87) PCT Pub. No.: WO2021/183916
PCT Pub. Date: Sep. 16, 2021

(65) Prior Publication Data
US 2023/0113561 A1 Apr. 13, 2023

Related U.S. Application Data

(60) Provisional application No. 63/002,599, filed on Mar. 31, 2020, provisional application No. 62/989,474, filed on Mar. 13, 2020.

(51) Int. Cl.
*H03G 5/16* (2006.01)
*G10L 19/02* (2013.01)
(Continued)

(52) U.S. Cl.
CPC ......... *H03G 9/005* (2013.01); *G10L 19/0208* (2013.01); *H03G 9/025* (2013.01)

(58) Field of Classification Search
CPC ..... H03G 9/005; H03G 9/025; G10L 19/0208
(Continued)

(56) References Cited

U.S. PATENT DOCUMENTS 5,956,674 A 9/1999 Smyth et al.
8,036,265 B1 10/2011 Reynolds et al.
(Continued)

FOREIGN PATENT DOCUMENTS

| EP | 0864146 | 9/1998 |
| WO | 2019/063547 | 4/2019 |
| WO | 2019/172715 | 9/2019 |

OTHER PUBLICATIONS

Transmittal of the International Search Report and Written Opinion of the International Search Authority—Russia—mailed Jun. 3, 2021 for International Application No. PCT/US21/22153, 10 pages.
(Continued)

*Primary Examiner* — William J Deane, Jr.
(74) *Attorney, Agent, or Firm* — Jackson Walker LLP; Christopher J. Rourk

(57) ABSTRACT

A method for loudness equalization is provided that includes receiving input loudness data at an audio processing system. Converting gain data of the input loudness data to a linear scale at the audio processing system. Determining a reciprocal of a gain-linear loudness value as a function of the converted gain data using the audio processing system. Determining a compression ratio using the audio processing system. Performing temporal smoothing and look ahead processing using the audio processing system. Outputting gain data as a function of the temporal smoothing and look ahead processing using the audio processing system.

20 Claims, 15 Drawing Sheets

(51) Int. Cl.
*H03G 9/00* (2006.01)
*H03G 9/02* (2006.01)
*H04R 3/04* (2006.01)

(58) Field of Classification Search
USPC .................................. 381/106, 103, 107, 104
See application file for complete search history.

(56) References Cited

U.S. PATENT DOCUMENTS

| | | | |
|---|---|---|---|
| 8,090,122 B2 * | 1/2012 | Baumgarte | H03G 5/165 |
| | | | 381/119 |
| 8,520,979 B2 | 8/2013 | Conwell | |
| 8,688,999 B2 | 4/2014 | Conwell | |
| 9,015,093 B1 | 4/2015 | Commons | |
| 9,218,429 B2 | 12/2015 | Levy | |
| 9,351,010 B2 | 5/2016 | Dougherty, III et al. | |
| 9,559,650 B1 * | 1/2017 | Skovenborg | H03G 7/002 |
| 9,565,508 B1 * | 2/2017 | Skovenborg | H04S 3/006 |
| 9,799,041 B2 | 10/2017 | Karty et al. | |
| 10,002,337 B2 | 6/2018 | Siddique et al. | |
| 10,685,054 B2 | 6/2020 | Crouse et al. | |
| 2009/0161883 A1 * | 6/2009 | Katsianos | H04S 7/00 |
| | | | 381/57 |
| 2013/0195277 A1 * | 8/2013 | Kannan | H04R 1/32 |
| | | | 381/98 |
| 2015/0036842 A1 * | 2/2015 | Robinson | G06F 3/165 |
| | | | 381/103 |
| 2015/0222990 A1 * | 8/2015 | Hansen | H04R 3/04 |
| | | | 381/103 |
| 2015/0253688 A1 * | 9/2015 | Yamauchi | G03G 9/09392 |
| | | | 430/105 |
| 2016/0086108 A1 | 3/2016 | Abelow | |
| 2017/0094409 A1 * | 3/2017 | Baumgarte | G10L 19/167 |
| 2019/0341069 A1 | 11/2019 | Muesch | |
| 2020/0045471 A1 * | 2/2020 | Song | H04R 9/06 |
| 2020/0258538 A1 * | 8/2020 | Deruty | G10L 21/003 |
| 2021/0375754 A1 * | 12/2021 | Landesberger | H05K 1/11 |
| 2023/0328451 A1 * | 10/2023 | Yang | H04R 9/06 |
| | | | 381/117 |

OTHER PUBLICATIONS

Transmittal of the International Preliminary Report on Patentability mailed by the World Intellectual Property Organizaton containing the Written Opinion of the Inernational Search Authority—Russia—mailed on Sep. 22, 2022 for International Application No. PCT/US21/22153, 8 pages.

* cited by examiner

LOUDNESS EQUALIZATION SYSTEM

TECHNICAL FIELD

The present disclosure relates generally to audio data, and more specifically to a system and method for loudness equalization and low-complexity and perceptually optimized sub-band coding.

BACKGROUND OF THE INVENTION

Audio coding is known in the art, but suffers from numerous problems that impair the enjoyment of recreated audio.

SUMMARY OF THE INVENTION

A method for loudness equalization is provided that includes receiving input loudness data at an audio processing system. Gain data of the input loudness data is converted to a linear scale at the audio processing system. A reciprocal of a gain-linear loudness value is determined as a function of the converted gain data using the audio processing system. A compression ratio is determined using the audio processing system. Temporal smoothing and look ahead processing is performed using the audio processing system. Gain data is output as a function of the temporal smoothing and look ahead processing using the audio processing system.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which.

DETAILED DESCRIPTION OF THE INVENTION

Figure 1:
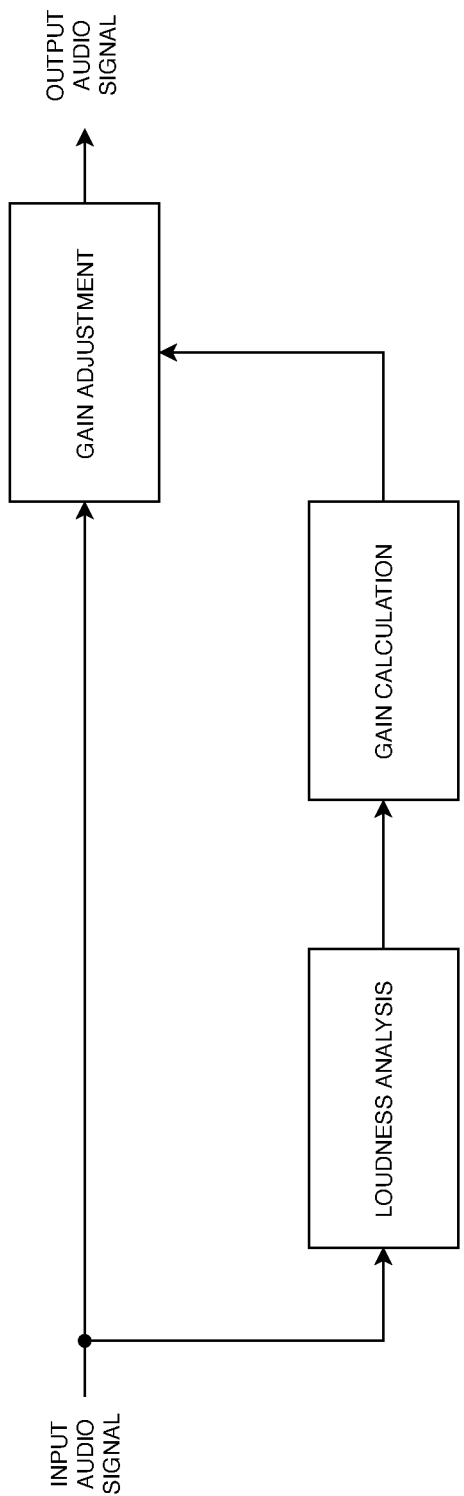
FIG. 1 is a schematic diagram of an example implementation of processing input audio signal to obtain output audio signal with desired loudness, according to the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

[2] Loudness is a subjective perception of sound pressure. There have been many attempts to measure loudness, but due to the perceptual component of loudness, it is difficult to quantify loudness. An equal-loudness contour is a measure of sound pressure level in dB over the frequency spectrum. It is to measure how a listener perceives a constant loudness at different frequencies when presented with pure steady tones. Loudness is affected by various parameters, including sound pressure, frequency, spectral composition, time structure and the duration of exposure of the sound signal.

Loudness is an almost-instantaneous property of sound. That is, a person perceives different parts of audio that have different loudness on a second-by-second (or sub-second) basis. The fraction of a second over which individuals' perception integrates loudness varies between individuals.

Loudness is positively related to Root Mean Square (RMS) value of the audio signal. That is, larger RMS value has larger loudness. But, for a given RMS level, loudness also depends on how broad a range of frequencies the energy or power is spread over. That is, white noise at a given RMS level will be perceived as much louder than a pure tone having the same RMS. In fact, a not-quite-pure tone, which may be spread over a small frequency range, will have similar loudness per RMS to a pure tone. Noted that "energy" and "power" are used interchangeably in the present disclosure.

FIG. 1 is a schematic diagram of an example implementation of processing input audio signal to obtain output audio signal with desired loudness, according to the present disclosure. The audio input is first analyzed to generate loudness metric of the input signal. The loudness is converted to PCM-linear terms (Pulse-code Modulation) in loudness analysis. The gain is calculated as the reciprocal of the PCM-linear terms. The gain is next adjusted to be smoothed in time. The relative order of steps after generating loudness metric is not important but may make some difference depending on implementation. If complete equalization is not desired, the gain can be raised to a power <1 (e.g. during gain calculation).

Loudness Analysis

The sensitivity of loudness to spectrum can be modeled by splitting the audio spectrum into a set of relatively narrow frequency "bands", such that the frequencies within a band are treated approximately as if they were all at the same frequency. The exact band boundaries do not matter, but the spacing of bands matters. The spacing of bands is determined based on human perception. For example, two signals would have to be far apart in frequency that they contribute "separately" to human perception of loudness. One attempt to match human perception of loudness is a 50 Hz spacing up to some frequency, followed by logarithmic spacing above that frequency.

A particularly CPU-efficient loudness metric can use an N-log N time complexity block-based time-frequency transform, such as Fast Fourier Transform (FFT), to split the audio into bands.

Common FFT implementation supports power-of-2 block lengths. Short FFT (FFT having short block lengths) gives better time resolution but worse frequency resolution. To achieve reasonable frequency resolution (sub-50 Hz), a relatively long FFT (FFT having long block lengths), for example, at least 1024 samples for 44/48 kHz-sampled audio, is needed. The implementation that uses 2048 samples is found working significantly better.

A naive block transform has some undesirable properties. One undesirable property is that the transform tends to detect energy that doesn't actually exist at frequencies that are divisible by 1/block_length. A common approach to reduce this undesirable property is to apply a "window function", for example, a Hann Window, to each block before the block is processed. A window function has the side effect of discounting the importance of what happens near the block boundaries. A transient that falls near a block boundary would therefore be mostly ignored, which is undesirable. To avoid this side effect of window function, another common approach to reduce the undesirable property is to work on the overlapping blocks. For example, in the present disclosure, 50% overlap is being used, which means the 2048-sample transform blocks are spaced every 1024 samples.

Loudness Metric

Figure 2:
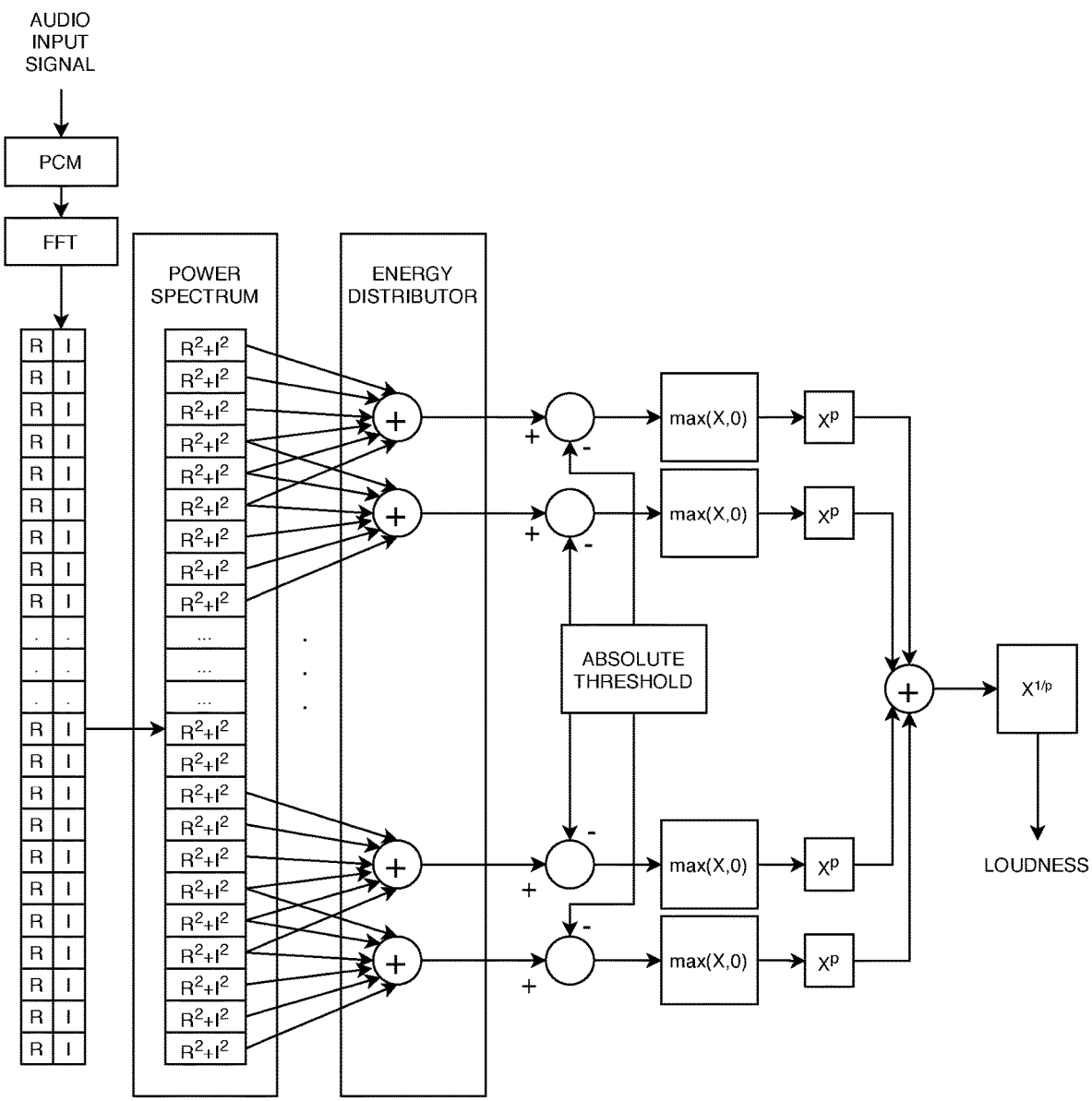
FIG. 2 is a schematic block diagram of an example implementation of calculating loudness metric from an audio input signal, according to the present disclosure.

FIG. 2 is a schematic block diagram of an example implementation of calculating loudness metric from an input audio signal, according to the present disclosure. The audio input signal is sampled by pulse-code modulation (PCM) and then transformed using a time-frequency transform, e.g. FFT. Each value of the output signal from the time-frequency transform, e.g. FFT has a real component (R) and an imaginary component (I). Power spectrum is to computer energy per frequency band. Energy distributor is to determine weights on energy computed per frequency band.

An example implementation of computing energy per frequency band is called "power spectrum" in FIG. 2. The energy per frequency band is calculated by adding the square of each value's real component (R) to the square of the value's imaginary component (I). Then non-linear weights are calculated and applied to the energy per frequency band.

The sensitivity of human perception to broad-spectrum signals is modeled using an L-p norm (p<1). That is, loudness L=(sum(band_energyp)) (1/p). The value p=1/1.75~=0.6 is found to be a good match for the perceived loudness of broadband noise relative to pure tones.

Energy Distributor

Figure 3:
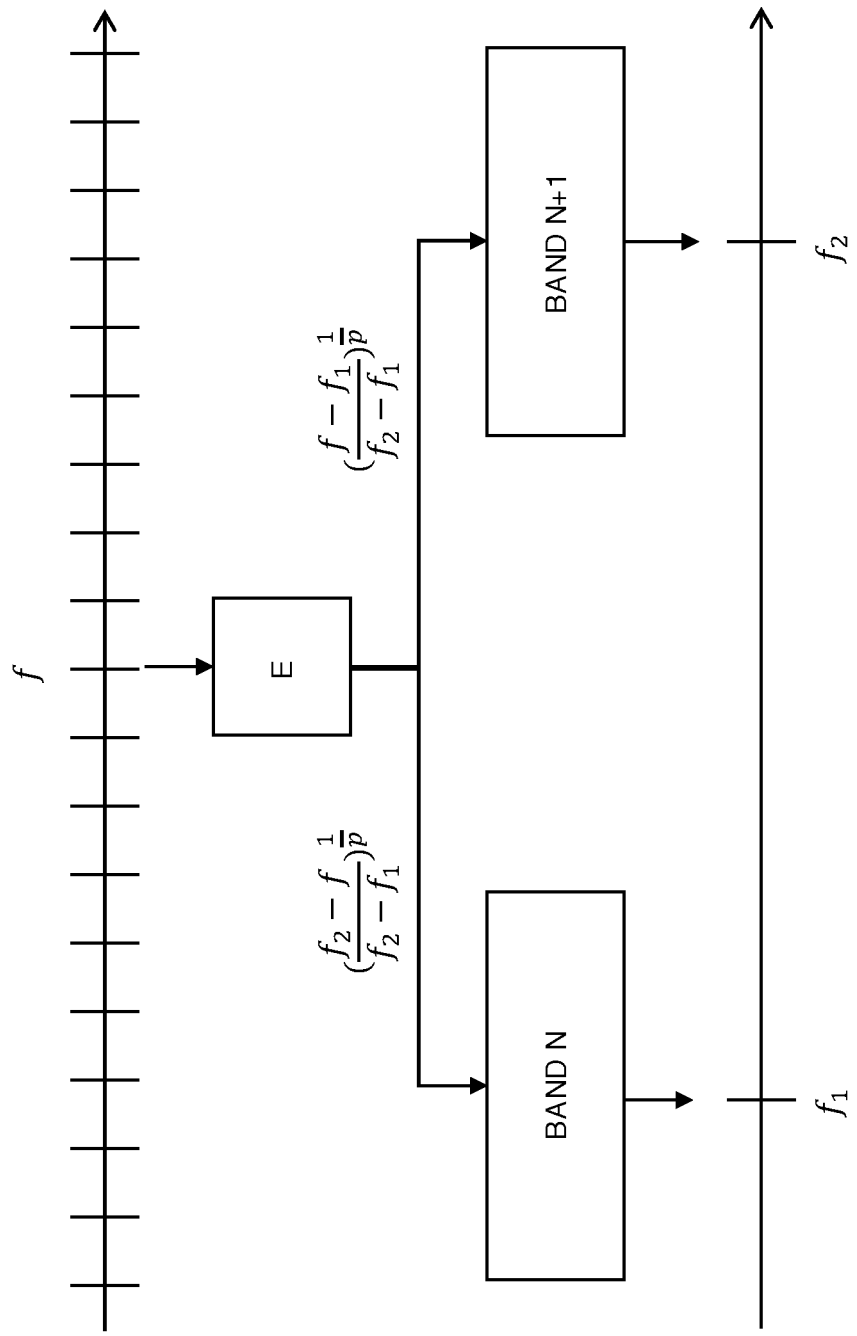
FIG. 3 is a schematic block diagram of an example implementation that illustrates how energy distributor works for a given transform line's energy, according to the present disclosure.

FIG. 3 is an example implementation that illustrates how energy distributor works for a given transform line's energy, according to the present disclosure.

A challenge exists with mapping transform line energy (frequency-linear spacing) to perceptual band energy (generally not frequency-linear spacing). In particular, it is desirable for the loudness metric to treat pure tones of similar frequencies as having similar loudness. That is, a tone that occurs in the middle of a perceptual band should have roughly the same loudness as a tone that occurs at a boundary of that same perceptual band with an adjacent band. This can be achieved by using a line-to-band energy distributor that uses non-linear weights based on the power above (for instance, power 0.6).

Consider the task of distributing the energy e of a lobe centered at frequency f into 2 adjacent perceptual bands having center frequencies f1 and f2, f1<=f<=f2. A linear approach would be to assign (f2−f)/(f1−f2)*e to the first band and (f−f1)/(f1−f2)*e to the second band. But, due to power 0.6 used in summing perceptual band energies, this approach would give different loudness for the cases f=f1 (center of band) vs f=(f1+f2)/2 (band boundary). In the center-of-band case, L=(ep) (1/p)=e. In the band-boundary case, L=((0.5*e)p+(0.5*e)p) (1/p)=(2*(0.5p)*ep) (1/p)=2(1/p)*0.5*e=2(1/p−1)*e, which for p=0.6 is ~1.6*e. That is, the band-boundary tone is treated as 1.6 times "louder" due to being distributed over 2 bands.

To solve this, the weights (e.g., (f2−f)/(f1−f2)) are raised to power 1/p. So in the boundary case, instead of each band getting half the energy, it gets e*0.5(1/p), i.e. 0.31*e (for p=0.6). Then loudness L for the boundary case is (2*(e*0.5 (1/p))p) (1/p)=(2*ep*0.5) (1/p)=e.

Calculating Absolute Threshold

Human hearing is not sensitive at all to sounds below some level. The level is frequency-dependent (usually higher at low frequencies). Noise in the environment raises this level. To model this, a step of "absolute threshold" can be inserted between the sum at the output of "energy distributor" and Xp. A constant (but frequency-dependent) value is subtracted from each band's sum. If the result is less than 0, the result is treated as 0 (the contribution of a band to loudness is never negative). A polynomial approximation is used to model the threshold as a function of frequency, but other methods (e.g. table-based) can also work.

Effect of listening level on absolute threshold. The absolute threshold technically does not depend on the listening level—it only depends on background noise. But the signal energy does depend on the listening level, so the ratio of the two (signal energy and absolute threshold) depend on the listening level. At a louder listening level, more of the signal will be above the absolute threshold; at a lower listening level, more of it will be below the threshold. The listening level can be molded as a constant offset (in dB) added to the loudness-threshold-vs-frequency curve. That is, the absolute threshold is calculated in dB as a function of frequency, then a constant is added, then dB is converted to power for the subtraction. Knowing the "correct" value of the constant is difficult due to the number of listening environment variables that affect it (for example, amplifier gain, speaker sensitivity, room acoustics, listener distance from speaker). A full-scale sine wave reaches the listener is arbitrarily assumed at 90 dB SPL. A system with more knowledge of the listening environment (including volume knob settings) could make a more educated guess.

Converting Loudness to PCM-Linear Terms

The loudness L described above is in the "energy" domain in the sense that spectrally similar signals whose energies are in ratio N:1 will have L values in the same N:1 ratio. If the goal were computing perceptually uniform loudness, L would be raised to an additional power (e.g. 0.3) to match a perceptually uniform loudness scale. But, since the loudness equalization application aims to maintain constant loudness, the perceptually uniform scale is irrelevant. The square root of L can be taken to convert energy-based loudness to gain-linear loudness.

Gain Calculation

Figure 4:
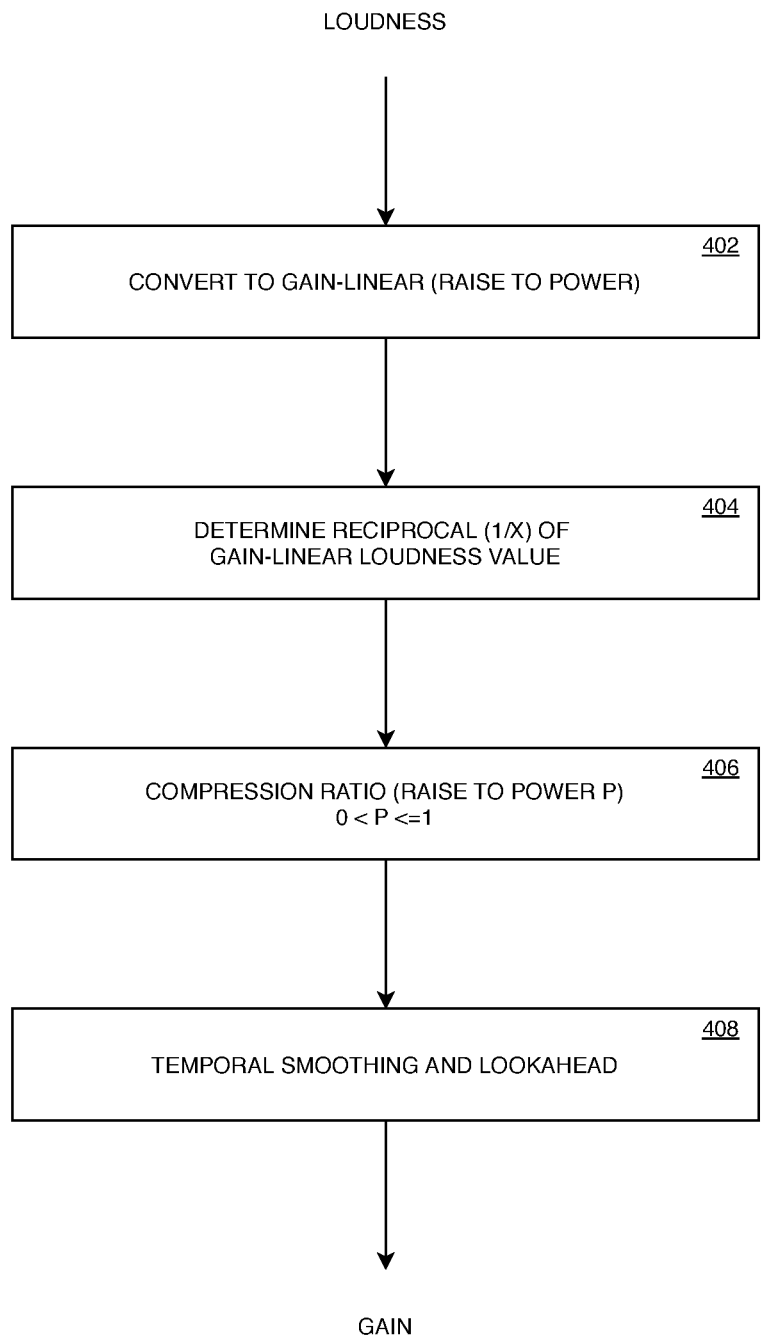
FIG. 4 is a flowchart of an example implementation of calculating gain based on previously calculated loudness, according to the present disclosure.

FIG. 4 is a flowchart of an example implementation of gain calculation based on previously calculated loudness, according to the present disclosure. It should be noted that the relative order of steps 402-408 are not fixed and can be reordered according to different implementations.

The gain is calculated by Gain=c/linear_loudness, where c is a constant. c is based on the desired target level of output PCM. Higher c values give overall louder output, and lower c values reduce the likelihood of clipping.

For listeners whose loudness perception window approximately matches the transform block spacing, no further time averaging is needed. Many listeners are less peak-sensitive, so for them the stream of instantaneous (spaced every 1024 samples) loudness values can be passed through a low-pass filter (e.g. sliding average over a fraction of a second) to obtain perceived loudness. It is possible to combine the instantaneous loudness values in a non-linear way. For instance, using RMS to give larger values in the window more weight.

Maximal loudness equalization over time can be achieved by simply applying a gain to each block that is the reciprocal (1/x) of the block's gain-linear loudness value. Then a step of temporal smoothing of the loudness (or gain) values is adopted to prevent the following two issues. First, quiet blocks of mostly-noise would become audible. An upper bound on the applied gain is needed to prevent audible noise. Gains of up to 30 dB tend to be acceptable for most content. 40 dB is acceptable for some content, and a maximum of as low as 20 dB may be needed for some content under good listening conditions. Second, especially for music, a perfectly constant-loudness stream would sound bad due to lack of dynamics.

For music tracks/albums, it is often desirable to avoid altering the content's dynamics at all. This is achieved by applying a constant gain to the entire track. Various methods of aggregating instantaneous loudness over the track's duration are possible, for example, peak, average (mean), RMS, percentile (e.g. 95% or median). Such an implementation does not approach consistent loudness, but it at least equalizes relative to each other music tracks which have similar dynamics but were mastered at different levels for random (e.g. historical) reasons.

For content where preserving dynamics is not as important, better loudness equalization is achieved by using an audio compressor (i.e. automatic gain control). Applied gain is the inverse of calculated loudness (optionally, the gain is raised to a power <1). To avoid extreme compression artifacts, it is still desirable to pass the calculated gain through a time-smoothing window. For example, looking 2 seconds ahead and taking the smallest gain appropriate for any block within that window.

Figure 5:
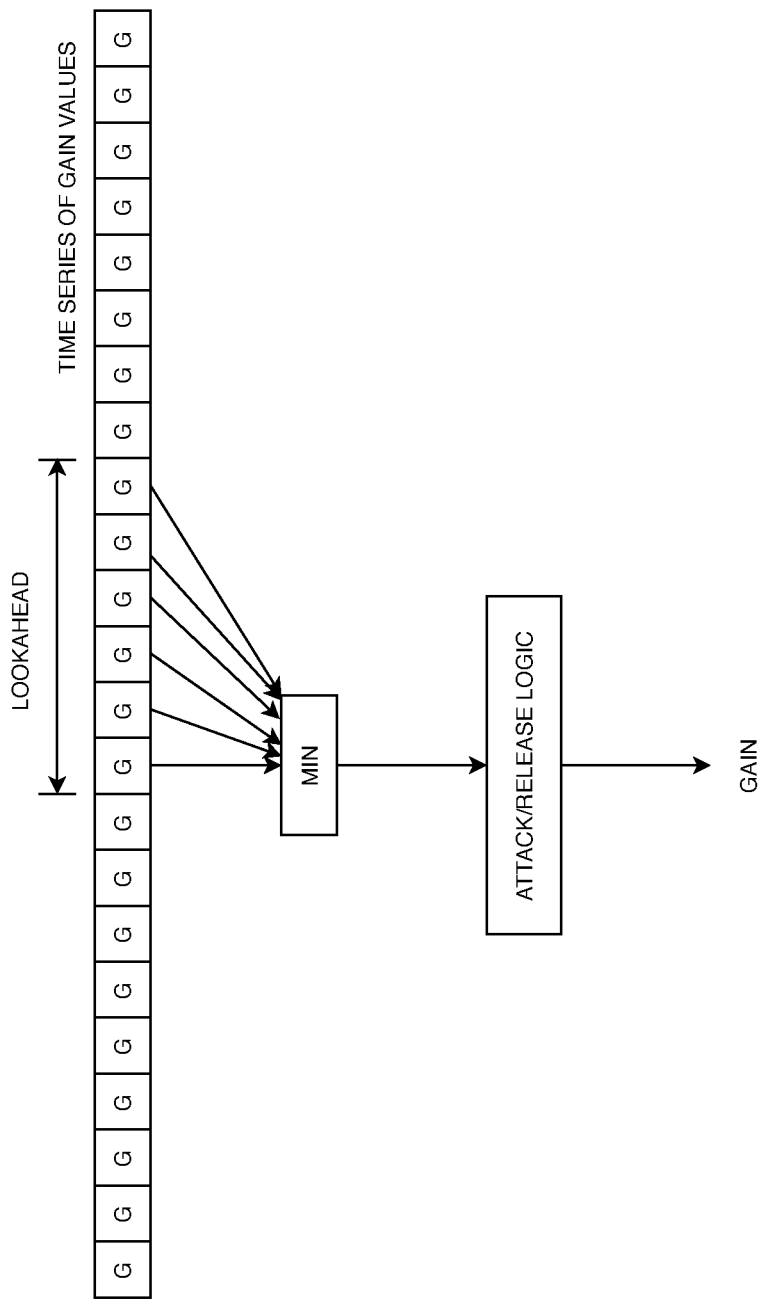
FIG. 5 is a schematic diagram of an example implementation of temporal smoothing and look ahead, according to the present disclosure.

FIG. 5 is a schematic diagram of an example implementation of temporal smoothing and look ahead, according to the present disclosure. The minimum gain value is determined by looking ahead N blocks in the time series of gain values. Then the gain is obtained by applying an attack/release logic on the minimum gain value. That is, if any time during the next N seconds there is a signal at least as loud as that on which the current gain is based, then gain is not increased. This prevents pumping artifacts in music, and, for large N, it preserves longer-term content dynamics. In a streaming scenario, N can be a variable (up to an upper bound) based on the fullness of downloaded buffer in order to minimize startup latency (e.g. after seeking).

Figure 6:
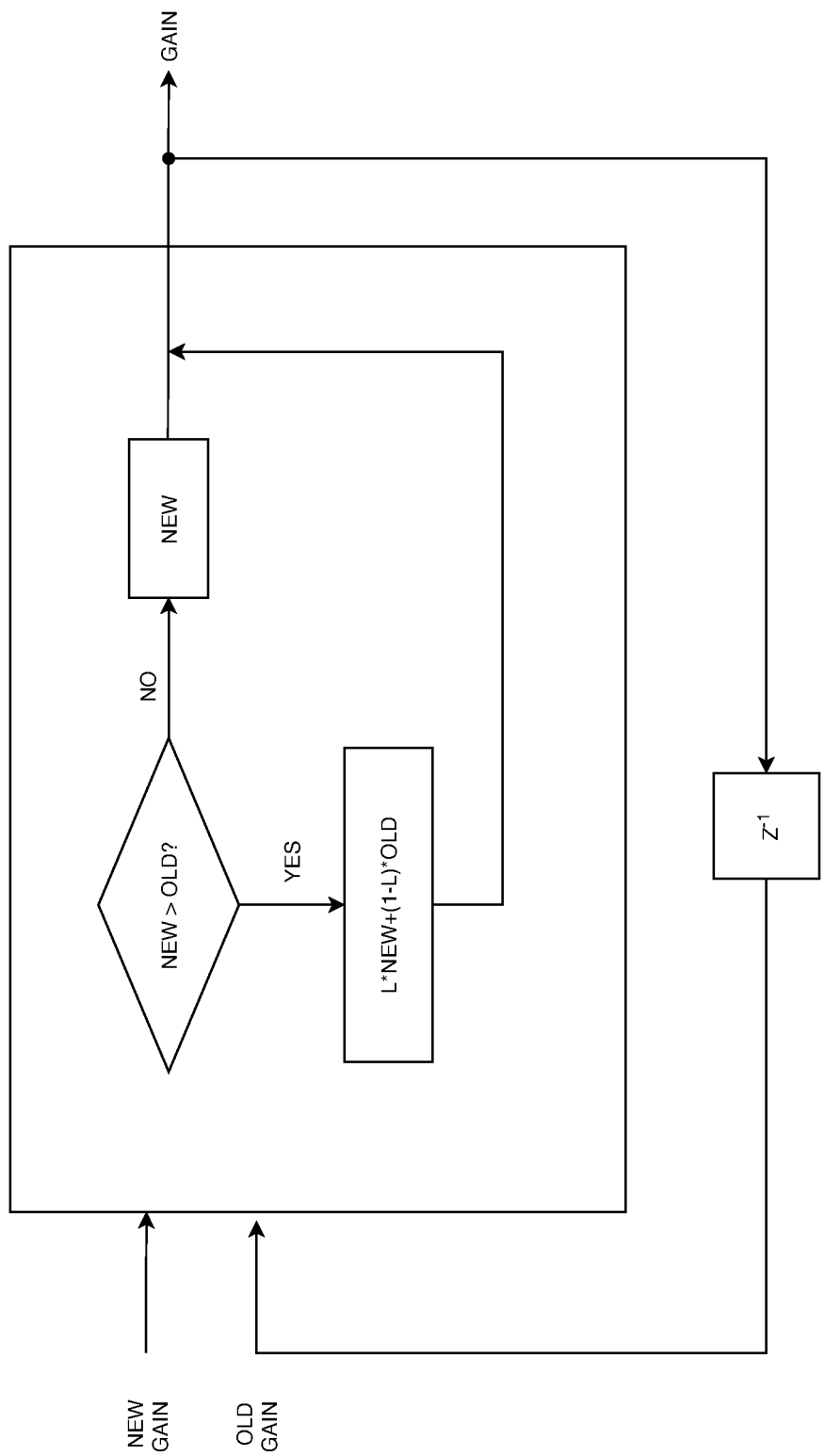
FIG. 6 is a flowchart of an example implementation of applying attack/release logic, according to the present disclosure.

FIG. 6 is a flowchart of an example implementation of applying attack/release logic, according to the present disclosure. If the new gain is smaller than the old gain, the new gain will be used as the gain output. Otherwise, the loudness L will be added into the calculation to determine the gain. The old gain is obtained by adding a time delay on the gain output. It is usually desirable for the gain to react quicker to increased loudness than to reduced loudness. Whereas in traditional analog compressors the gain's behavior in each direction (up/down) is modeled by a simple time constant (exponential decay towards the target, typically separate time constants for up vs down), in a digital implementation the gain response pattern is arbitrary. Reacting to increased loudness instantly, for example at the 50 ms block level, can achieve preferable outcome where gain is adjusted over the duration of 1 block. For decreased loudness, reacting with a short time constant (fraction of a second) can generate preferable outcome.

Long Audio Streams

Figure 7:
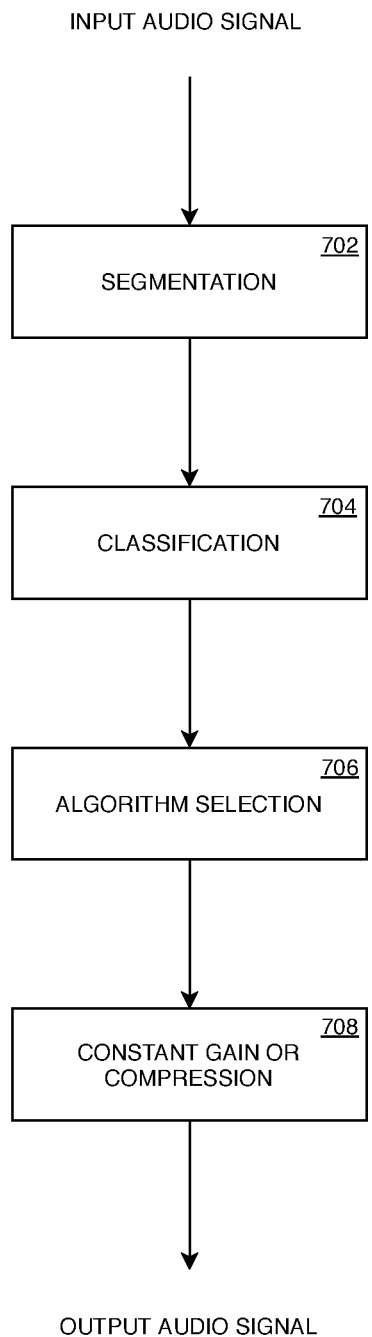
FIG. 7 is a flowchart of an example implementation of processing long audio stream, according to the present disclosure.

FIG. 7 is a flowchart of an example implementation of processing long audio stream, according to the present disclosure. The present implementation is able to process long audio stream in many minutes.

Segmentation

A long audio stream that contains a mix of music (for which dynamics should be preserved) and other content can be automatically split into segments. For example, a long audio stream can be split into segments based on regions of near-silence. Optionally the long audio stream can also be split based on fade-out level patterns. The resulting segments can be classified as music or not, and different gain adjustment methods can be applied to different segments.

Segmentation can be based on "gaps" of energy and/or waveform envelope. An example implementation assigns each gap a score, and all the gaps are added in a greedy fashion until the expected average number of segments per minute (e.g. 0.5) is achieved. Greedy fashion means starting with the deepest gap. Gap score is based on the gap's depth (level drop) and duration. Shallow gaps are likely parts of a track, and deep but very short gaps can happen in some, for example, purely percussive music.

Figure 8:
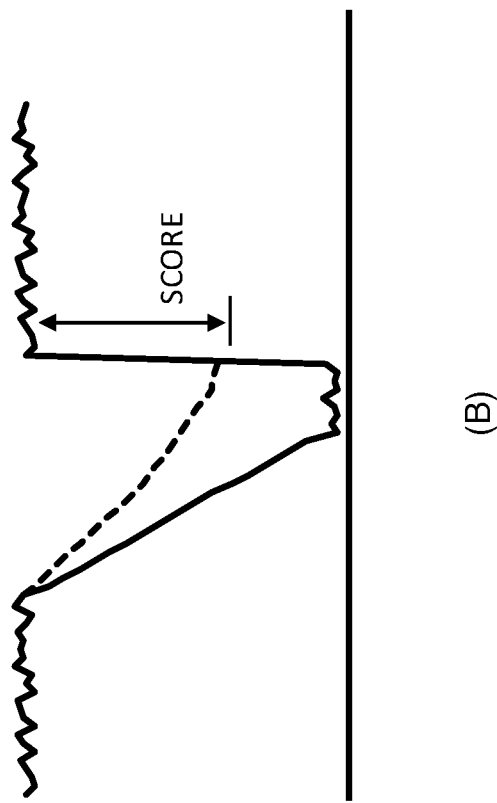
FIG. 8 is a schematic diagram of an example implementation of two gaps having different gap scores, according to the present disclosure.
Figure 8:
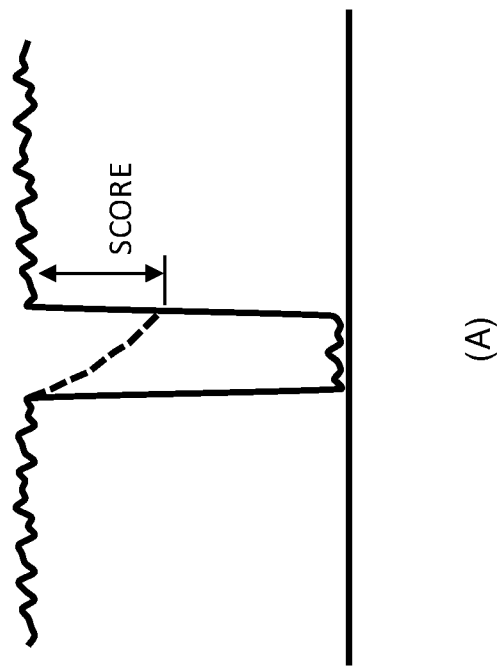

Additionally, a fade-out waveform pattern (shrinking envelope) contributes to the gap score of a gap immediately following the fade-out. FIG. 8 is a schematic diagram of an example implementation of two gaps having different gap scores, according to the present disclosure. Both gaps (A) and (B) have the same depth and duration, but the gap (B) has a higher gap score because it is preceded by a fade-out. The higher gap score is achieved by using a decay model where the level tracked by the model (dashed line) drops at a constrained rate when the signal is below the model, and immediately snaps to the signal when the signal is above the model. The decay model can be an exponential decay. The lowest level reached by the model is the gap score. The dashed lines in (A) and (B) are meant to look like they follow the same exponential decay rule, but the dashed line in (B) reaches a lower level because the fade-out before the gap gives the model additional time to decay. The intuition behind this is that the pattern of (B), which is a gap with a fade-out, is less likely to occur in the middle of a song than a simple gap without a fade-out (the pattern of (A)).

Simply adding gaps in their decreasing order of depth (starting with the deepest one) is problematic. Consider an hour-long audio stream, which is expected to have about 30 segments. Suppose the stream contains one song produced using modern tools to have many very deep gaps. It could happen that the 30 deepest gaps of the audio track all occur during that song. Such a segmentation is useless. So, for the purposes of adding gaps, a gap's score is adjusted by a measure of how close it is to existing gaps that have already been selected. For example, a candidate gap that is larger or equal to 2 minutes removed on both sides from the nearest already selected gap can be considered without hesitation. A candidate gap 10 seconds away from an already-selected gap, on the other hand, should be heavily discounted. According to an example implementation of the present invention, a non-linear sigmoid discount function, which looks similar to the positive half of inverse tangent (arctan) is used as a function of distance to the nearest already-selected gap. Gaps that are only seconds away from already-selected gaps have their score multiplied by a small number (e.g. 1), whereas gaps that are minutes away from the nearest already selected gap have their score almost unaltered, which is multiplied by a number just under 1.

Classification

Figure 9:
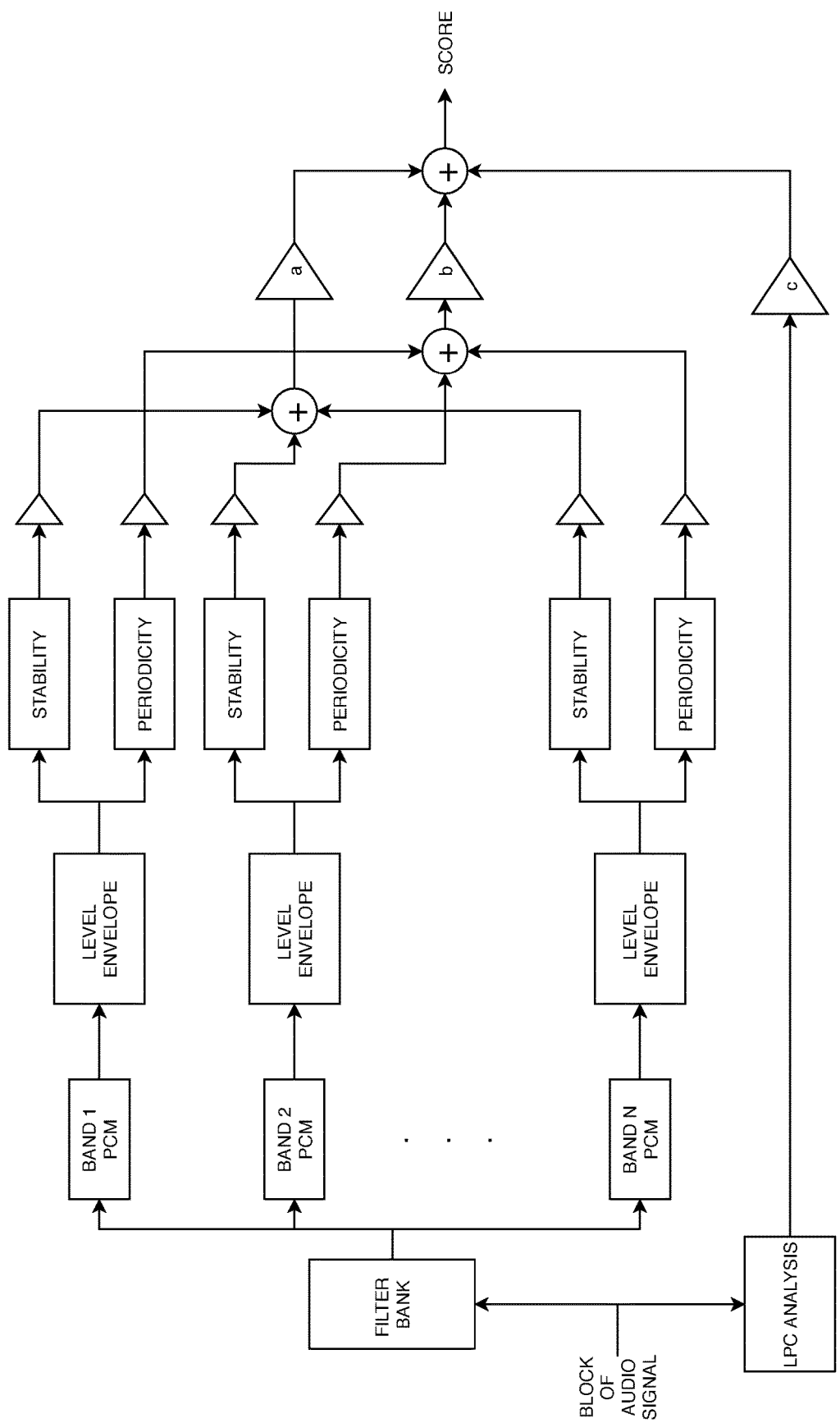
FIG. 9 is a schematic illustration of an example process of speech/music classification, according to the present disclosure.

FIG. 9 is a schematic illustration of an example process of speech/music classification, according to the present disclosure. Blocks of audio signal are filtered into multiple PCM bands. Stability score and periodicity score are calculated for each level envelope. Gains a, b, and c are calculated for each PCM band by given weights to different scores.

Music can be detected based on the presence of sustained notes, presence of rhythm (periodicity of waveform envelope), and spectral complexity (e.g. LPC model residual fall-off pattern). Sustained notes and rhythm can be detected either in the entire signal or in sub-regions of its spectrum. For example, in perceptual bands such as barks scale or Equivalent Rectangular Bandwidth (ERB). The periodicity scores and stability scores should be at least weighted by the energy fraction that the band contributes to. For example, it would be wrong to give much weight to properties of a low-energy band that is mostly noise. Additionally, it may make sense to apply a fixed frequency-dependent weighting if, for example, periodicity is known to be a more reliable indicator of music for bass and treble than for mid-range. Noted that stability score is to measure how constant in level the signal is. That is, how one block is changing compared to the next block.

Naturally, each criterion (e.g. stability or periodicity) produces its own "musicality" score. The weights given to different scores, which are illustrated in FIG. 9 as gains a, b, and c, can be machine-learned if a sufficiently large sample of known-good classifications is available.

Stability can be modeled by computing a score, for each pair of consecutive blocks. This process considers both (1) how low the signal levels in the blocks are, and (2) how different the signal levels are. The first criterion avoids chaotic low-level noise, and the second criterion favors block-to-block stable signals. An example implementation to compute such a score is lower−(higher−lower)=2*lower−higher, where "lower" and "higher" are the 2 blocks' levels ordered by level. For example, 2 consecutive blocks having levels 15 and 10 would have a score of 5, while 2 consecutive blocks both having levels 10 would have the same score of 10.

The levels used for stability computation can be non-linear (e.g. logarithmic, i.e. dB).

The block-pair stability scores can be aggregated over the duration of the segment using any aggregation math function (e.g. mean or RMS). To avoid a disproportionate contribution from random noise level variations (where there is no real signal), a lower bound can be imposed on each block level before it is considered for block-pair score computation. For example, 2 consecutive blocks having levels −60 and −90 might be considered equivalent to 2 consecutive blocks both having levels −60. That's because, in both cases, the level basically indicates noise. To avoid inconsistencies for identical tracks mastered at different levels, the threshold can be relative to the track's average RMS, rather than an absolute decibel relative to full scale (dB FS) value.

Rhythm can be measured as the peakiness of a time-frequency transform (e.g. FFT) of the time-series of block levels. Noted that peakiness means the spectrum has a lot of spikes and peaks. The idea is that a periodic envelope will have some FFT lines noticeably larger than others, whereas a non-periodic signals' FFT will look more like random noise.

Consider 64 consecutive 2048-sample PCM blocks, each block having a single "level" (computed peak, RMS, etc. of the sample values), take the FFT of the sequence of 64 values, convert it to power spectrum as the square magnitude of each FFT output line, and measure the peakiness of the resulting power spectrum. A simple peakiness measure is the peak-to-RMS (or peak-to-average) ratio of the power spectrum. It is important to exclude the bottom few (e.g. 3) FFT lines because almost all signal envelopes have a significant DC (constant) component, and the size of that component relative to higher frequencies is more a function of dynamics processing used in mastering than of the signal's periodicity.

One approach for calculating the number of spectrum lines to be excluded is to assume that any apparent periodicity with a period longer than some value is spurious (not real). For example, if the periods in music are assumed to rarely exceed 4 seconds, then for a block of 512 4096-sample blocks (sampled at 44.1 kHz), a 4-second period corresponds to approximately line 12 of a DTFT (FFT). I.e., the longer the audio segment being analyzed, the larger the number of bottom FFT lines excluded from periodicity analysis.

Figure 10A:
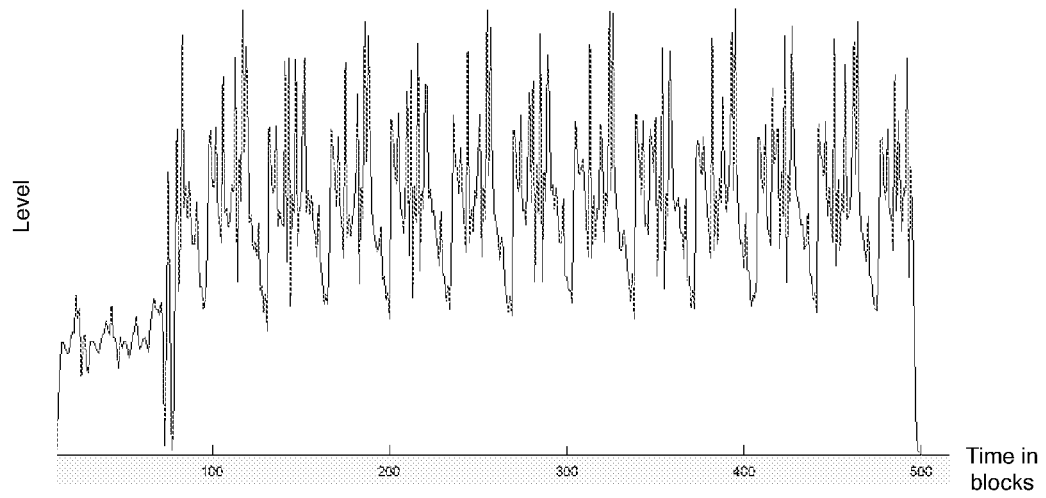
FIG. 10A is a plot diagram of an example periodic waveform in time domain, according to the present disclosure.

FIG. 10A is a plot diagram of an example periodic waveform in time domain, according to the present disclosure. Noted that the y axis can be level, amplitude, or other indications of the level of the signal. The plot shows considerable periodicity from index 100 to 500.

Figure 10B:
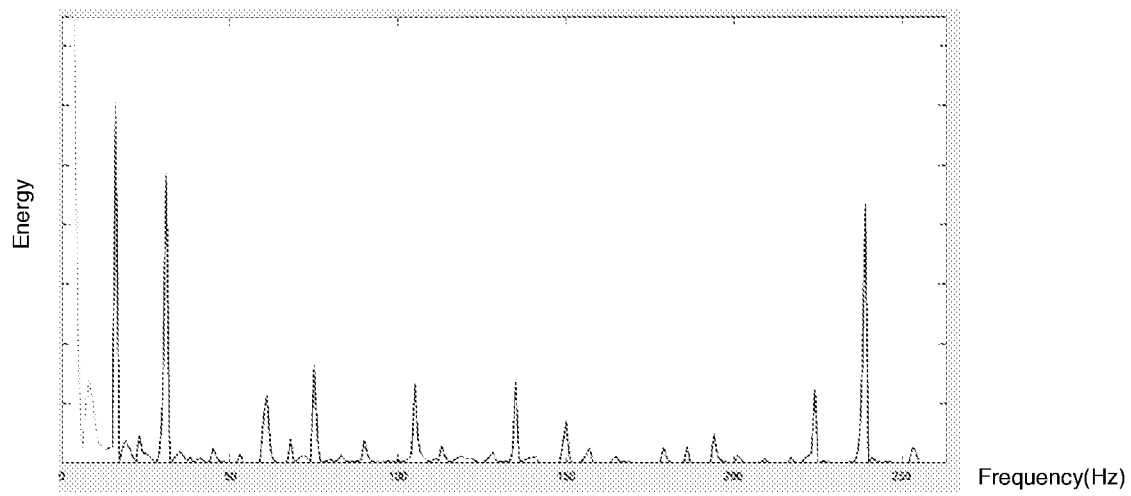
FIG. 10B is a plot diagram of an example periodic waveform in frequency domain, according to the present disclosure.

FIG. 10B is a plot diagram of an example periodic waveform in frequency domain, according to the present disclosure. The plot shows that the signal has an RMS-to-mean ratio of 3.7 and a peak-to-mean ratio of 36, which is highly non-uniform. Noted that the y axis can be energy (in power spectrum), amplitude or magnitude of the spectrum.

Figure 11A:
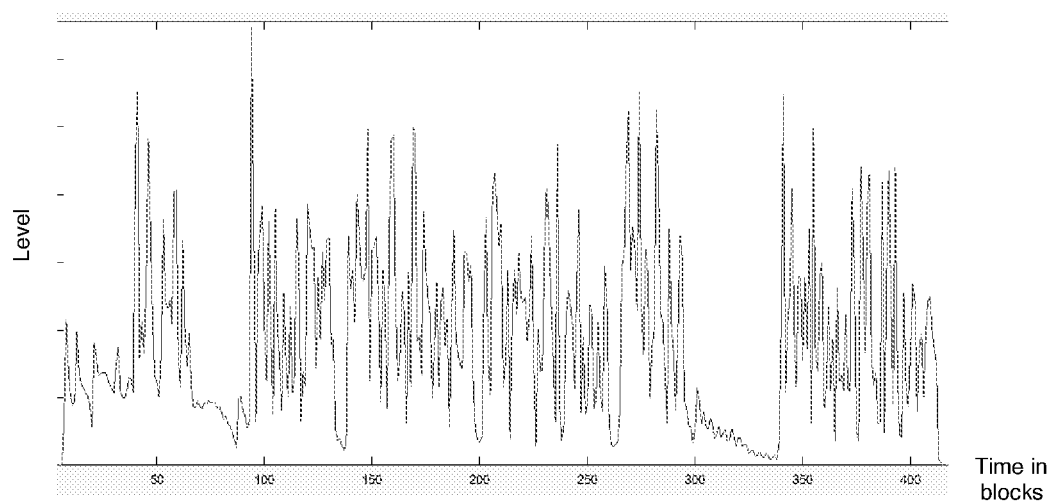
FIG. 11A is a plot diagram of an example non-periodic waveform in time domain, according to the present disclosure.
Figure 11B:
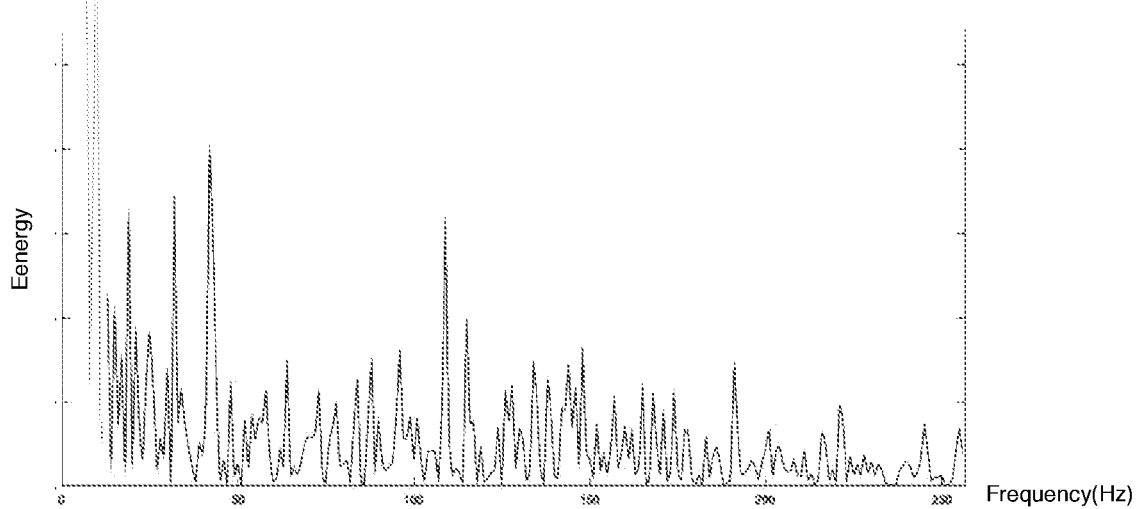
FIG. 11B is a plot diagram of an example non-periodic waveform in frequency domain, according to the present disclosure.

By contrast, FIG. 11A and FIG. 11B show example non-periodic waveform in the time domain and the frequency domain. The waveform in FIG. 11A does not show significant periodicity. FIG. 11B has considerably lower RMS-to-mean (1.5) and peak-to-mean (7.7) ratios. Note that the lighter grey portions of the spectrum graphs FIG. 10B and FIG. 11B (from index 0 to 12) were excluded from the peak/RMS/mean calculations as per the previous paragraph.

In a sub-band coder, each band of the coder can be encoded by an Adaptive Pulse-code Modulation (APCM) or Adaptive Differential Pulse-code Modulation (ADPCM) codec running independently on that band. A complex overall control structure can also or alternatively be used that controls step size and quantization of each band.

According to the present disclosure, an example implementation uses a modification of the standard APCM (or ADPCM if appropriate) adaption scheme to apply a substantial optimization based on the operation of the human ear. This implementation substantially reduces the bit rate of the coded signal, without adding perceived distortion or noise to the signal.

Figure 12:
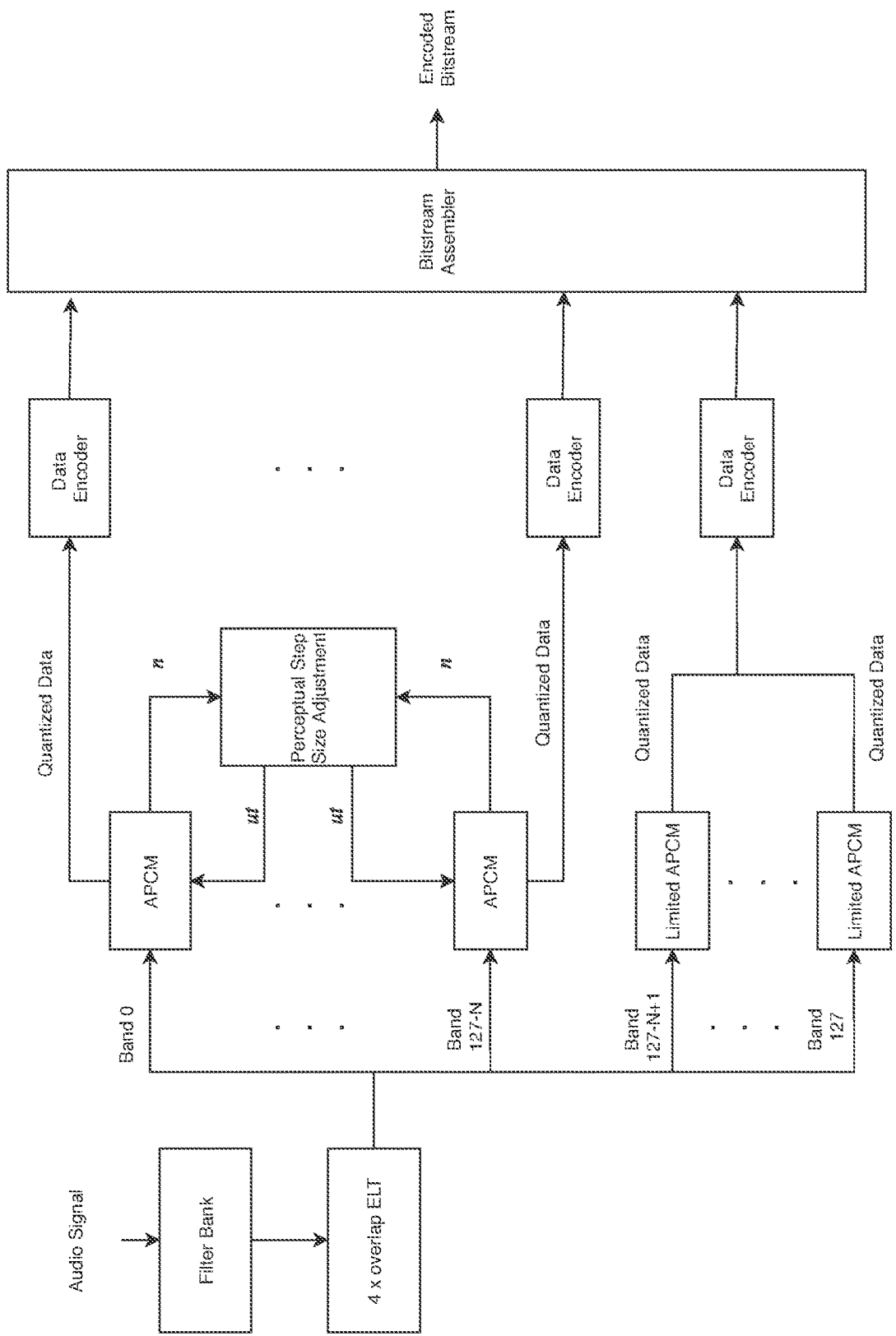
FIG. 12 is a schematic block diagram of an example implementation of an encoder, according to the present disclosure.

FIG. 12 is a schematic block diagram of an example implementation of an encoder, according to the present disclosure. The components and elements of the schematic block diagram can be implemented in hardware or a suitable combination of hardware and software, such as one or more algorithms operating on special purpose audio processing system components. This example embodiment includes the following aspects, but a person of skill in the art will recognize that modifications can be made to this example embodiment without deviating from the novel and non-obvious aspects of the disclosure.

An example implementation can be applied to a signal encoded with 16 bits at a 48 kHz sampling rate. The audio signal can be filtered into 128 sub-bands and a ¾ overlap Extended Lap Transform (ELT) can be applied on the sub-bands. An example of an ELT that can be used in the present implementation is discussed in H. S. Malvar, "Extended lapped transforms: properties, applications, and fast algorithms," in IEEE Transactions on Signal Processing, vol. 40, no. 11, pp. 2703-2714, November 1992, although it is noted that the application of the ELT as described in the present disclosure is not suggested or evident based on that discussion of ELT. Instead, the present disclosure recognizes that ELT can be applied as discussed, which has not been previously recognized.

Bands 0 to 127-N, where N is determined by the characteristics of the audio signal, such as sampling rate, can be quantized using APCM and can have step sizes modified by a perceptual step size adjustment circuit. Bands 0 to 127-N are the sub-bands that are lower than a frequency threshold, where the frequency threshold can be 20,050 Hz or lower as determined by subjective listening test, desired system bandwidth or other factors. The step size calculated from an individual APCM is provided to the perceptual step size adjustment circuit that looks at all bands coded with the same target bit depth. A parametric design for step size multipliers that allows for partial-bit transmission rate is used to generate a preliminary step size for the next input signal quantization. The quantized data is then provided to a data encoder using lossless data encoding such as Huffman encoding. The encoded data outputs from the data encoder are provided to a bitstream assembler to generate encoded bitstream. The lower bands, which are substantially wider than one Equivalent Rectangular Bandwidth (ERB), are quantized finely enough by using APCM to provide audibly transparent encoding of these lower bands. The bits required to encode these lower bands can be easily provided by the high-frequency bands that are coded with very low resolution (bands 127-N+1 to 127). Above the point where a band is above 0.5 ERB's wide, but below 1 ERB, these bands are quantized at approximately 6 bits, which provide an appropriate resolution within one ERB.

The sub-bands completely above the frequency threshold, 20,050 Hz or lower as determined by subjective listening test or desired system bandwidth, are quantized and encoded using fewer bits. Each of these high-frequency bands (band 127-N+1 to band 127) is quantized by an individual limited APCM. All of these high-frequency bands can share one data encoder, or two or more data encoders can also or alternatively be used, where suitable. Note that the encoding scheme these high-frequency bands employ may be different from the data encoder used by lower frequency bands. One difference is that it is an ad-hoc scheme, where "0" means "nothing in any of the bands" and "1" means it is followed by a series of 0s or 1s for whether or not each band has energy. For the bands that have energy, the value is coded using a generic integer-coding scheme.

Figure 13:
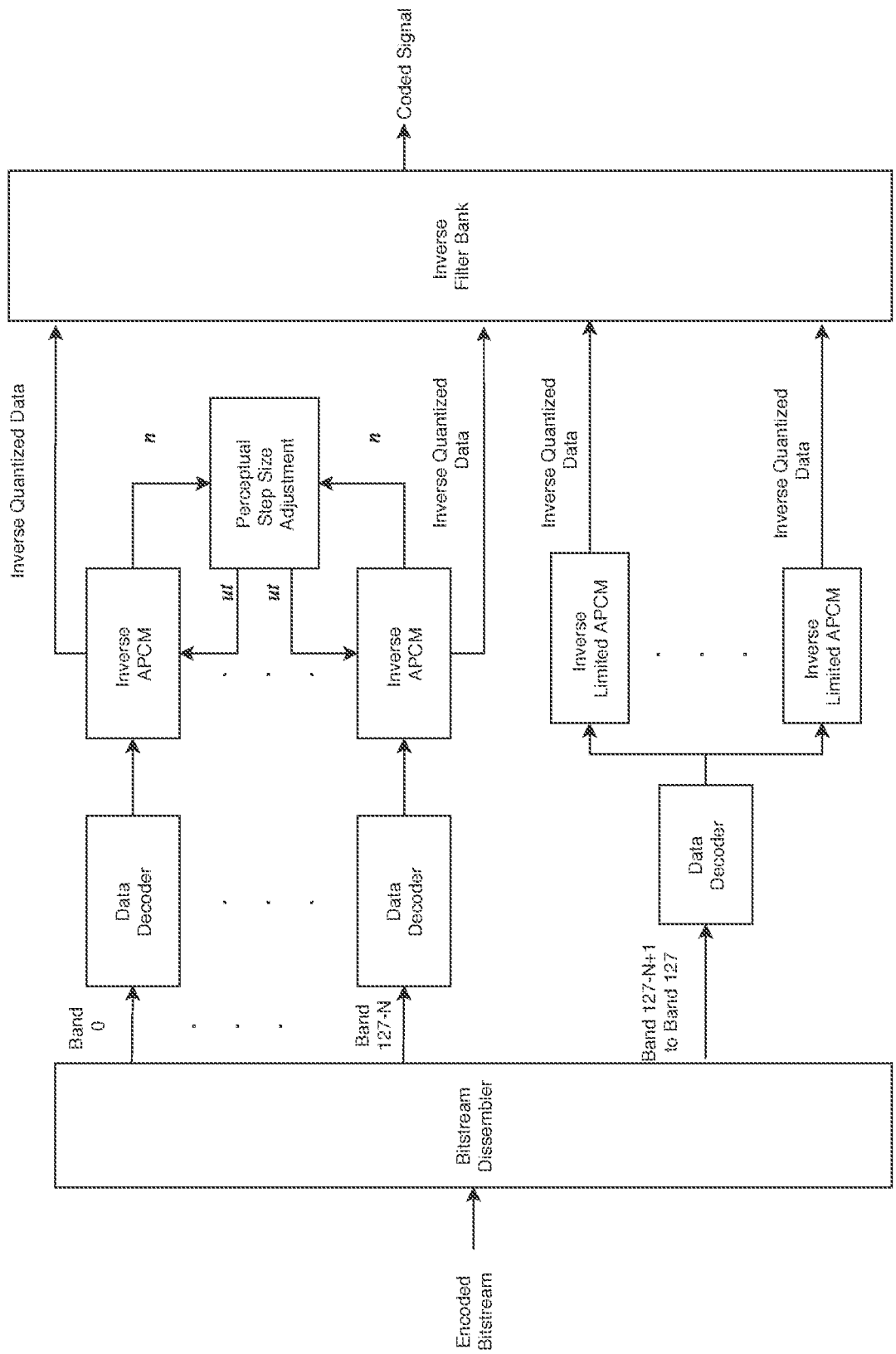
FIG. 13 is a schematic block diagram of an example implementation of a decoder, according to the present disclosure.

FIG. 13 is a schematic block diagram of an example implementation of a decoder, according to the present disclosure. The components and elements of the schematic block diagram can be implemented in hardware or a suitable combination of hardware and software, such as one or more algorithms operating on special purpose audio processing system components. This example embodiment includes the following aspects, but a person of skill in the art will recognize that modifications can be made to this example embodiment without deviating from the novel and non-obvious aspects of the disclosure.

The encoded bitstream can be dissembled by a bitstream dissembler into 128 sub-bands. Each of bands 0 to 127-N can be decoded by a data decoder. The data decoders can use Huffman decoding or other lossless decoding methods. The inverse quantized data from each inverse APCM is provided to the perceptual step size adjustment circuit. Each of the inverse quantized data is provided to an inverse filter bank.

The high-frequency sub-bands above the frequency threshold (bands 127-N+1 to 127) share one data decoder and they are decoded at a lower bitrate. Each of the decoded high-frequency sub-bands is inverse quantized using an inverse limited APCM. The inverse quantized data obtained from each inverse limited APCM is provided to the inverse filter bank along with other inverse quantized data from inverse APCM. Similar to the encoding scheme discussed above, the decoding scheme these high-frequency bands employ may be different from the data decoder used by the lower frequency bands.

Figure 14:
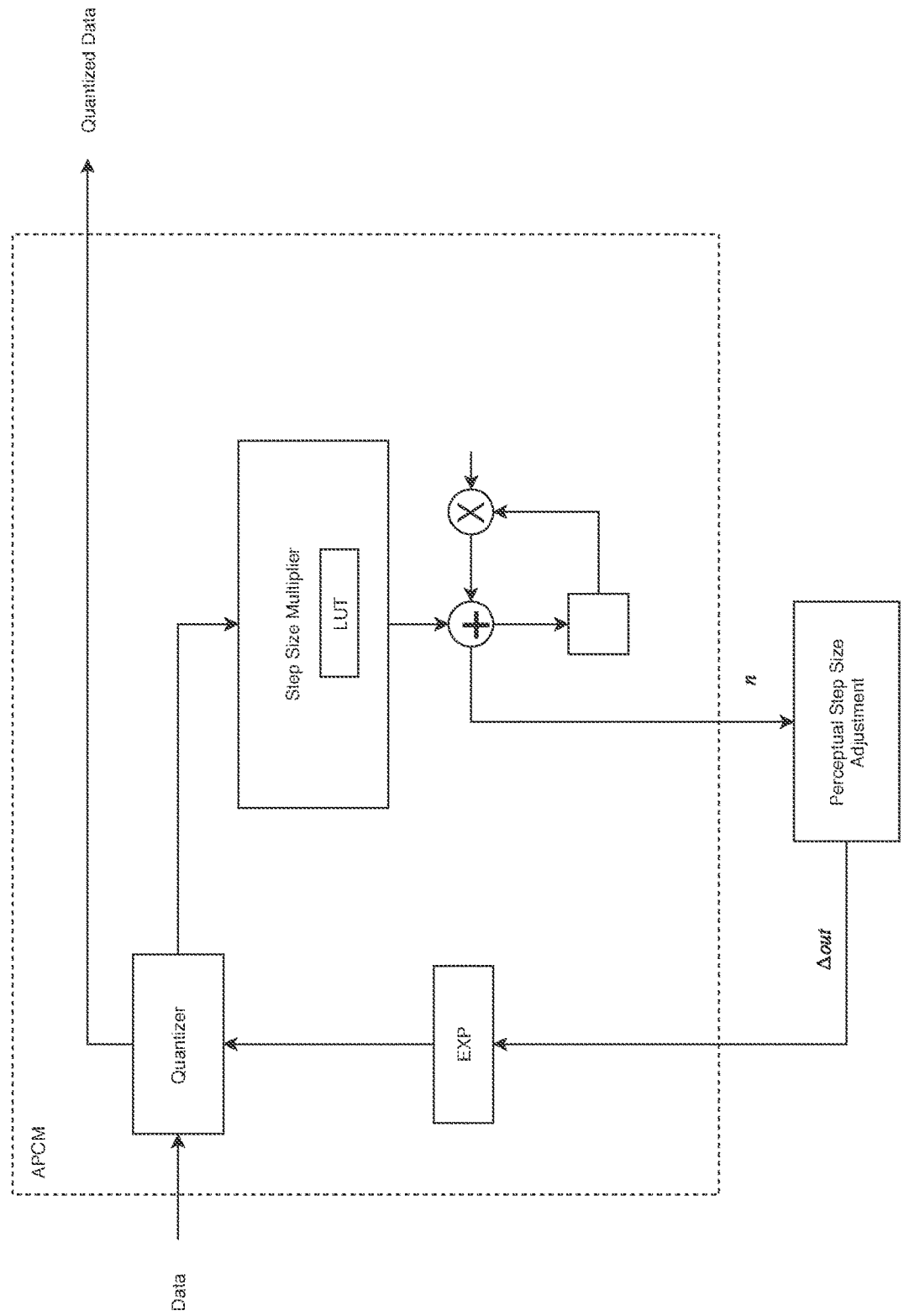
FIG. 14 is a schematic block diagram of an example implementation of APCM coder, according to the present disclosure.

FIG. 14 is a schematic block diagram of an example implementation of APCM coder, according to the present disclosure. The components and elements of the schematic block diagram can be implemented in hardware or a suitable combination of hardware and software, such as one or more algorithms operating on special purpose audio processing system components. This example embodiment includes the following aspects, but a person of skill in the art will recognize that modifications can be made to this example embodiment without deviating from the novel and non-obvious aspects of the disclosure.

As illustrated, the APCM coder comprises a step size multiplier that selects a multiplier based on the individual band's bit target. The step size multiplier can comprise a look-up table (LUT). The multiplier selected is provided to an adder and a delay circuit. The delayed output from the delay circuit is multiplied by a factor 0 and provided to the adder again, to be added with the multiplier selected. The results are provided to a perceptual step size adjustment circuit that generates a new step size. The exponential of the new step size (EXP) is provided to the quantizer. The output from the quantizer is quantized data and provided for the next step.

The APCM coder in the example implementation uses the standard Goodman-Gersho robust step-size algorithm (see D. J. Goodman and A. Gersho, "Theory of an adaptive quantizer," 1973 IEEE Conference on Decision and Control including the 12th Symposium on Adaptive Processes, San Diego, CA, USA, 1973, pp. 361-365), with multipliers for the step size used by a parametric optimization for maximized signal-to-noise ratio (SNR) vs. bit rate. It is noted that the application of the Goodman-Gersho algorithm as described in the present disclosure is not suggested or evident based on that discussion of the Goodman-Gersho algorithm. Instead, the present disclosure recognizes that the Goodman-Gersho algorithm can be applied as discussed, which has not been previously recognized.

In addition, the quantizer can be encoded by a noiseless coding scheme that accommodates the probability of the various output code words, and that is configured to allow very large quantized values when necessary. Unlike most APCM systems, this system can operate between 5 bits/sample and 14 bits/sample, with the exact number of average bits determined by a configuration file, hence the parameterization of step size multipliers that allows, when combined with the noiseless coding scheme, for adjustment to any fractional rate between 4 bits and many bits, so that the average rate needs not be an integer number of bits per quantizer.

Figure 15:
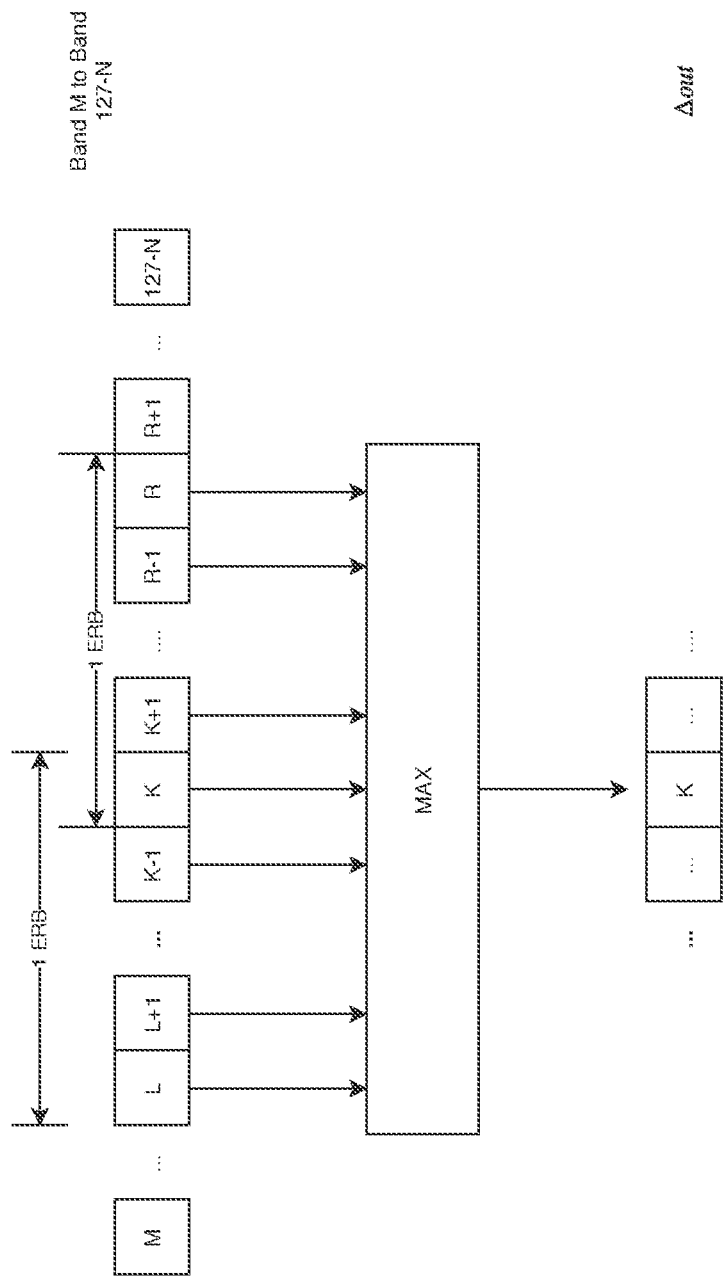
FIG. 15 is a schematic block diagram of an example implementation of perceptual step size adjustment, according to the present disclosure.

FIG. 15 is a schematic block diagram of an example implementation of perceptual step size adjustment, according to the present disclosure. The components and elements of the schematic block diagram can be implemented in hardware or a suitable combination of hardware and software, such as one or more algorithms operating on special purpose audio processing system components. This example embodiment includes the following aspects, but a person of skill in the art will recognize that modifications can be made to this example embodiment without deviating from the novel and non-obvious aspects of the disclosure.

Inefficiency in coding can arise when two bands together occupy less than one ERB from the lower edge of the lower band to the upper edge of the upper band. First, the standard APCM step size is calculated. Consider bands M to 127-N, where M is the first band that is narrower than half an ERB (for the relevant range of frequencies, bands get narrower in terms of ERBs as the band index gets higher). Within this set of bands M to 127-N, the following adjustment logic is applied, as shown in FIG. 4. Each band K's adjusted step size is the maximum (MAX) of the unadjusted step sizes of bands L to R, where L and R are defined as follows. Let bottom(x) and top(x) denote the low and high ends of the range of frequencies covered by band x. L is the lowest band index (but not lower than M) such that top(K)−bottom(L) <=1 ERB. R is the highest band index (but not higher than 127-N) such that top(R)−bottom(K)<=1 ERB.

In regards to a step size multiplier, multipliers in an APCM (or ADPCM) system can determine how the quantization step size changes as a function of the current (integer) output. For example, for a low-resolution quantizer, the following multipliers can be used: 0.8, 0.9, 1.3, 1.7, 1.7, 1.7, . . . That means: (1) when quantizer outputs integer 0, multiply the step size by 0.8; (2) when quantizer outputs integer 1, multiply the step size by 0.9; (3) when quantizer outputs integer 2, multiply the step size by 1.3; (4) when quantizer outputs integer 3 or larger, multiply the step size by 1.7.

Note that these multipliers implicitly define a "target" output value (in this case between 1 and 2). That is, when presented with steady input (same value repeated), the step size eventually converges around a value that causes the quantizer to output integers around the target value. This "target" concept is important in the present disclosure.

For low-bit quantizers, optimal quantizer values can be determined based on signal statistics. For 5+ bit quantizers (such as the present case), optimization may be impractical.

In regards to parametrization, since a high-resolution quantizer can output tens of thousands of different possible integer output values, optimizing individual multiplier values seems impractical. Therefore, an implementation of parametrizing a multiplier curve and optimizing the parameters experimentally by running the codec can be used to simplify the process with no noticeable loss of performance. A "multiplier curve" is a function that maps a quantizer output value to a step size multiplier.

It is noted that, for sufficiently high resolutions, the shape of the multiplier curve has no reason to depend on the exact resolution. For example, consider an 8-bit quantizer (target output value 256) vs a 12-bit quantizer (target 4096). There is no reason to think that the step size multiplier for 512 output with the 8-bit quantizer should be substantially different from the step size multiplier for 8192 output with the 12-bit quantizer other than by scaling the value input to the multiplier table. In both cases the output exceeds the "target" by a factor of 2. Therefore, the input to the quantizer curve is defined as the (floating-point) ratio of "integer output value" to "target value". For instance, for 512 output with 256 target, the multiplier curve input is 2.0.

Additionally, the target value can be anything, which doesn't have to be integer, and certainly doesn't have to be a power of 2. An "N-bit quantizer" can be defined as simply one having target=$2^{(N-1)}$, where 1 is reserved for the sign bit, and that N need not be an integer. But this is tangential. That is, regardless of the quantizer's intended bit depth, the task of the example implementation is to find the optimal curve that maps the output/target ratio to a multiplier. By definition of "target", this curve is 1.0 at 1.0 (no need to change the step size when the quantizer is already outputting the target value).

From here on, "input" is the (quantizer output)/target ratio. The parametrization of an example implementation is as follows: (1) for input <=1, the multiplier is input^a; (2) for input >=2, the multiplier is input^1 (i.e. aggressive 100% adaptation when the target is exceeded by >=2x); (3) for 1<input<2, the multiplier is 1+(input−1)^b.

Additionally, the multiplier is constrained to be between e.g. 0.1 and 10 to prevent overly aggressive adaptation to anomalies. At this point it is noted that when chance causes a small multiplier due to a signal zero crossing, the only cost is a slight bitrate increase for a sample or two, due to the "no overload" nature of the noiseless coding that follows the APCM quantizer.

In regards to tuning, since a tradeoff is expected between bitrate and quality, an optimization process for tuning the parameters needs to somehow consider both bitrate and quality. Note that the "target" value affects both bitrate and quality and is independent of a and b.

When one of (a, b) is held constant, the "optimal" value of the other can be defined as that which maximizes the SNR for a given desired bitrate. For example, if a is held constant, the set of (b, target) is considered combinations that give the same desired bitrate and pick the (b, target) combination which, for that bitrate, gives the highest SNR. For instance, many b values iterated, and for each b value a binary search is performed over "target" values to find the "target" that gives the desired bitrate with the given b. The SNR is recorded each time and later the b value with the highest SNR is chosen.

Once b is tuned, the process for a can be repeated to find the value of a, which, given the new b, gives the best SNR for the desired bitrate. After this, b potentially needed to be re-tuned again (since b was originally tuned based on a different a). In practice this seems to converge well enough after about 3 iterations (pick a, tune b, tune a, re-tune b, done).

Interactions with Huffman re-training can be avoided during tuning by measuring the "entropy" of the stream of integers produced by the quantizers (standard entropy formula where each value is assumed to cost −Log 2(value's frequency) bits).

The above disclosure can be implemented by instrumenting the encoder to measure the SNR for each run. Defining "SNR" over a long audio sequence is well known to people in the art thus not described in detail, although its application as discussed herein is novel and non-obvious. Briefly, the following approach is used, where segment-by-segment sum-of-envelope-squares is divided by sum-of-quantization-step-squares. Both mean segment SNR and min segment SNR are tracked and some weighted mean of min SNR and mean SNR are used.

Log reduction used in the present disclosure can be found in the following papers: Johnston, J. D. and Goodman, D. J., "Multipurpose hardware for digital coding of audio signal," IEEE Trans. on Commun., 1978 and Johnston, J. D. and Goodman, D. J., "Multipurpose hardware for digital coding of audio signal," Proc. NTC77, 1977. It is noted that the application of log reduction as described in the present disclosure is not suggested or evident based on that discussion of log reduction. Instead, the present disclosure recognizes that log reduction can be applied as discussed, which has not been previously recognized.

In regards to default step sizes, APCM has a feedback loop intended to push the quantizer's output towards a certain range. When the quantizer is outputting values above that range, its step size is increased. When the quantizer is outputting values below the range, its step size is reduced.

Somewhat independent of the above is the choice of initial step size (at the beginning of a stream). A large initial step size is typically undesirable, as it would imply poor coding of small values at the beginning of a stream (a very common scenario). For APCM capable of coding very large integers, starting with a very small step size is normally a safe choice—high quality is ensured, and a high initial data rate can be handed easily by modern systems.

An additional consideration appears in the scenario of decoding from the middle of a stream (e.g. when the receiver is plugged/tuned into a stream that is already playing). Integer values in the middle of a stream generally hover around the target range. So using the same initial step size for all bands allows the decoder to initially (until step size adaptation takes over) output a flat-spectrum signal. This is undesirable because flat-spectrum signals are relatively unusual in music. The audible effects of flat-spectrum signal can be mitigated by using a sufficiently small initial step size (in which case the spectrum adapts before the signal becomes objectionably loud), but at the cost of taking longer to adapt the level.

In the present disclosure, the initial step size for multi-band APCM is set to a different value for each band, based on the band's approximate frequency. For example, the step size can be set to a smooth decreasing function of frequency such as 1/sqrt(f). However, below some frequency (a few hundred Hz) the step size should be relatively constant because extreme amounts of energy at very low frequencies are not very common in music. It is expected that one could further tune the initial step size curve (as a function of frequency) based on spectrum statistics from a training set of audio content.

In regards to efficient APCM high frequency coding, although few people can hear frequencies above 20 kHz, substantial bursts of energy at those frequencies do occasionally occur in music content. Throwing away the inaudible frequencies can have audible effects due to system non-linearities (e.g. clipping). An extreme example that illustrates the possibilities is a square wave. Removing the highest frequencies of a square wave normally causes oscillation (ringing). But if the square wave is close to digital full-scale, one side of the oscillation (above the square wave value) gets clipped. Audible effects have been observed from removing inaudible frequencies in such scenarios.

However, it is not necessary to code the highest frequencies with high fidelity. It is also not necessary to code low-magnitude high-frequency signals. APCM multipliers targeting relatively small output values (e.g. low-single-digits) can be used and the minimum allowed quantizer step size can be set to a relatively large value (e.g. −40 db). This coding strategy results in all 0s for all the high-frequency bands most of the time.

A simple but efficient entropy coding scheme for the above coding method uses 1 bit to indicate whether there are any non-zero values at all in any of the high-frequency bands. If there are not, no additional bits are needed. If there are, it is still possible that only a few of the bands have non-zero signal, so an additional code is sent to indicate which bands have non-zero signal. A simple but less efficient method is to send an N-bit array for N bands. More efficient schemes can be used to take advantage of the fact that time-frequency transform output tends to have similar levels in adjacent bands. For example, the N-bit array could be encoded using run-length coding. For the bands which have non-zero values, a suitable integer coding method (e.g. Rice/Golomb) can be used.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. A software system is typically created as an algorithmic source code by a human programmer, and the source code algorithm is then compiled into a machine language algorithm with the source code algorithm functions, and linked to the specific input/output devices, dynamic link libraries and other specific hardware and software components of a processor, which converts the processor from a general purpose processor into a specific purpose processor. This well-known process for implementing an algorithm using a processor should require no explanation for one of even rudimentary skill in the art. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. A system can receive one or more data inputs, such as data fields, user-entered data, control data in response to a user prompt or other suitable data, and can determine an action to take based on an algorithm, such as to proceed to a next algorithmic step if data is received, to repeat a prompt if data is not received, to perform a mathematical operation on two data fields, to sort or display data fields or to perform other suitable well-known algorithmic functions. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A method for loudness equalization, comprising:
receiving input loudness data at an audio processing system;
converting gain data of the input loudness data to a linear scale at the audio processing system;
determining a reciprocal of a gain-linear loudness value as a function of the converted gain data using the audio processing system;
determining a compression ratio using the audio processing system;
performing temporal smoothing and look ahead processing using the audio processing system; and
outputting gain data as a function of the temporal smoothing and look ahead processing using the audio processing system.

2. The method of claim 1 wherein converting the gain data of the input loudness data to the linear scale comprises raising the gain data to a power.

3. The method of claim 1 wherein determining a compression ratio comprises raising to a power.

4. The method of claim 3 wherein the power is greater than 0 and less than or equal to 1.

5. The method of claim 1 further comprising receiving an input audio signal at the audio processing system and outputting a gain-adjusted audio signal using the gain data.

6. The method of claim 5 further comprising performing segmentation processing of the input audio signal.

7. The method of claim 5 further comprising performing classification processing of the input audio signal.

8. The method of claim 5 further comprising selecting am algorithm for processing the input audio signal.

9. The method of claim 5 further comprising performing constant gain or compression processing of the input audio signal.

10. A method for processing audio data, comprising:
receiving an encoded audio data signal having a first bit rate;
generating a plurality of sub-bands of the encoded audio data signal;
performing adaptive pulse code modulation (APCM) processing of predetermined low frequency sub-bands of the encoded audio data signal at the first bit rate using a step size that is separately determined for each of the low frequency sub-bands; and
performing APCM processing of predetermined high frequency sub-bands of the encoded audio data signal at a second bit rate that is lower than the first bit rate using a step size that is separately determined for each of the high frequency sub-bands; and
generating an output audio signal using the APCM processed low frequency sub-bands of the encoded audio data signal and the APCM processed high frequency sub-bands of the encoded audio data signal.

11. The method of claim 10 wherein selection of the predetermined low-frequency bands is performed as a function of a sampling rate of the encoded audio signal.

12. The method of claim 10 wherein the step size is modified using a perceptual step size adjustment circuit.

13. The method of claim 10 wherein the step size is multiplied to allow for a partial-bit transmission rate.

14. The method of claim 13 wherein the partial-bit transmission rate is used to generate a preliminary step size for a next input signal quantization.

15. The method of claim 10 wherein encoded data outputs from a data encoder are provided to a bitstream assembler to generate an encoded bitstream.

16. The method of claim 10 wherein the predetermined high frequency bands are above a 0.5 equivalent rectangular bandwidth in width.

17. The method of claim 10 wherein the predetermined high frequency bands are between a 0.5 and 1.0 equivalent rectangular bandwidth in width.

18. The method of claim 10 wherein frequency bands between a 0.5 and 1.0 equivalent rectangular bandwidth in width are quantized at a lower bit rate.

19. The method of claim 10 wherein frequency bands between a 0.5 and 1.0 equivalent rectangular bandwidth in width are quantized at a bit rate of 6 bits or less.

20. The method of claim 10 wherein the high frequency bands are quantized at a lower bit rate to provide a resolution within one equivalent rectangular bandwidth.

* * * * *